(12) United States Patent
Nagayama et al.

(10) Patent No.: US 7,235,883 B2
(45) Date of Patent: Jun. 26, 2007

(54) LAYERED WIRING LINE OF SILVER ALLOY AND METHOD FOR FORMING THE SAME AND DISPLAY PANEL SUBSTRATE USING THE SAME

(75) Inventors: Kenichi Nagayama, Tsurugashima (JP); Akira Sugimoto, Tsurugashima (JP); Satoshi Miyaguchi, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/197,877

(22) Filed: Jul. 19, 2002

(65) Prior Publication Data

US 2003/0085403 A1    May 8, 2003

(30) Foreign Application Priority Data

Jul. 23, 2001    (JP)    ............................. 2001-222024

(51) Int. Cl.
*H01L 23/48*    (2006.01)
(52) U.S. Cl. ...................................... 257/762; 257/775
(58) Field of Classification Search ................. 257/72, 257/88, 90, 741, 762, 775–784; 313/498, 313/505, 504; 438/614, 617, 625, 703
See application file for complete search history.

(56) References Cited

U.S. PATENT DOCUMENTS 5,009,720 A * 4/1991 Hokuyo et al. .............. 136/255
6,157,127 A * 12/2000 Hosokawa et al. ......... 313/506

(Continued)

FOREIGN PATENT DOCUMENTS

CN    2482313 Y    3/2002

(Continued)

OTHER PUBLICATIONS

Aoshima, Yuki et al., "Development of Silver-Based Multilayer Coating Electrodes with Low Resistance for Use in Flat Panel Displays," Jpn. J. Appl. Phys., vol. 39, (Aug. 2000) pp. 4884-4889.

(Continued)

*Primary Examiner*—Tuan H. Nguyen
(74) *Attorney, Agent, or Firm*—Finnegan, Henderson, Farabow, Garrett & Dunner, L.L.P.

(57) ABSTRACT

A layered wiring line of silver or silver alloy includes a silver or silver alloy conductor layer including silver or silver alloy; and a protective conductor layer layered on and covering the silver or silver alloy conductor layer. A method for forming the layered wiring line includes steps of: layering the silver or silver alloy conductor layer and the protective conductor layer on a substrate in turn; making the protective conductor layer in contact with a liquid etchant common to the silver or silver alloy conductor layer and the protective conductor layer by a predetermined pattern. The protective conductor layer has a thickness satisfying a relationship in that a ratio of (the protective conductor layer's thickness)/(the silver or silver alloy conductor layer's thickness) is less than that of (a solution velocity of the protective conductor layer in the liquid etchant)/(a solution velocity of the silver or silver alloy conductor layer in the liquid etchant).

4 Claims, 5 Drawing Sheets

U.S. PATENT DOCUMENTS

| | | | |
|---|---|---|---|
| 6,157,257 A * | 12/2000 | Murphy | 330/252 |
| 6,165,034 A * | 12/2000 | Isono et al. | 445/6 |
| 6,459,464 B1 * | 10/2002 | Nakasima et al. | 349/141 |
| 6,492,275 B2 * | 12/2002 | Riley et al. | 438/696 |
| 6,495,275 B2 * | 12/2002 | Kamiguchi et al. | 428/692 |
| 6,506,440 B2 * | 1/2003 | Takahashi et al. | 427/77 |
| 6,850,307 B2 * | 2/2005 | Hinata | 349/147 |
| 2003/0087036 A1 * | 5/2003 | Takahashi et al. | 427/402 |

FOREIGN PATENT DOCUMENTS

| | | |
|---|---|---|
| EP | 0 888 035 A | 12/1998 |
| EP | 1 182 910 A | 2/2002 |
| JP | 2-253593 | 10/1990 |
| JP | 2001 004993 A | 1/2001 |
| JP | 2001 351778 A | 12/2001 |
| WO | WO 00/60907 A | 10/2000 |

OTHER PUBLICATIONS

Aoshima, Yuki et al., "Improvement of Alkali Durability of Silver-Based Multilayer Coatings for Use in Flat Panel Displays," Jpn. J. Appl. Phys., vol. 40, (Jun. 2001) pp. 4186-4170.

Alford, T.L. et al., Encapsulation of Ag films on $SiO_2$ by Ti reactions using Ag-Ti alloy/bilayer structures and an $NH_3$ ambient, Appl. Phys. Lett., (Jun. 1996)pp. 3251-3253.

Zeng, Yuxiao et al., "Texture and stress of Ag films in Ag/Ti, Ag/Cr bilayers, and self-encapsulated structures," J. appl. Phys., (Jun. 1999) pp. 7773-7777.

Laursen, T. et al., "Encapsulation of silver by nitridation of Ag-Ti alloy/bilayer structures," Thin Solid Films 290-291 (Jun. 1996) pp. 411-416.

European Search Report for corresponding European Patent Application No. EP 02 01 6496. Aug. 23, 2006.

English abstract for JP 2001 004993 A.

English Abstract for JP 2001 351778 A.

* cited by examiner

LAYERED WIRING LINE OF SILVER ALLOY AND METHOD FOR FORMING THE SAME AND DISPLAY PANEL SUBSTRATE USING THE SAME

BACKGROUND OF THE INVENTION

1. Field of the Invention

The present invention relates to a conductive wiring comprising silver or silver alloy and to a display panel substrate using the same.

2. Description of the Related Art

There are required the higher density of mounting electronic components or integrated circuits onto a printed circuit substrate, a display panel substrate used for a flat panel display device or the like, and also the narrower lines of wiring are required for the substrates. Thus, it is demanded that a wiring material should have a low resistivity.

As a use of a display panel substrate, there is an organic electroluminescence display panel for example.

The organic electroluminescence display panel has a plurality of organic electroluminescence devices formed on the substrate in a predetermined pattern. Each organic electroluminescence device comprises one or more thin films of organic compound materials at least one of which exhibits the electroluminescence (hereinafter also referred to as "EL") which is emits light in response to a current injected thereinto.

Generally, the organic EL device includes a transparent electrode as an anode, at least one organic compound thin film and a metal electrode as a cathode, which are laminated on a transparent substrate in due order. The organic compound thin film (so-called "organic functional layer") maybe a single light emitting layer, or a laminate which includes a three-layer structure composed of an organic hole transport layer, a light emitting layer and an organic electron transport layer, or a two-layer structure composed of an organic hole transport layer and a light emitting layer. The organic EL device may also include an electron or hole injection layer inserted between appropriate ones of these layers.

When the predetermined pattern is a grid matrix, for example, such a matrix type EL display panel has an image display array comprised of a plurality of light emitting pixels of organic EL devices arranged at respective intersections of intersecting rows and columns. The matrix display type one is composed of row electrodes including transparent electrode layers, organic functional layers, and column electrodes including metal electrode layers which intersect the row electrodes. These layers are laminated in sequence. The row electrodes are each formed in a strip shape, and arranged in parallel with each other with a predetermined spacing therebetween. The same is applied as well to the column electrodes. In this way, the display panel of matrix type has a display array region comprised of light emitting pixels which are formed of a plurality of organic EL devices positioned at respective intersections of a plurality of row electrodes with a plurality of column electrodes.

Since the organic EL device is of an electric current injection type, its consumption of electric power greatly depends on the resistivity of the electrode line. Thus, a low resistive material is strongly required for the row and column electrodes of the organic EL device otherwise a serious voltage drop occurs as involving in the luminance in homogeneousness to ruin the display quality.

There is a problem that the transparent electrode materials used for the anode such as indium tin oxide (ITO) or the like have high sheet resistance values, although a low resistive material is required for the wiring line connecting the electrodes to each other in the display array region of the substrate.

To lower the resistance of wiring, there is an attempt to use a metal line having a low resistivity as an auxiliary electrode for the wiring line connecting the transparent electrodes (the anodes) to each other in the display array region. Namely, the conventional manufacturing process of the EL display panel involves the steps of patterning the ITO anodes on the substrate, patterning the auxiliary metal lines, patterning the organic functional layers, patterning the ramparts, patterning the cathodes and connecting the cathodes and anodes to the corresponding external terminals.

Generally, the narrower the wiring line is formed to improve the luminance of each pixel in the organic EL display panel, the greater the numerical aperture becomes. Thus, an indispensable condition of the electrode material is to have a low resistivity.

Aluminum (Al) based materials is generally known as a low resistivity wiring material. When using the Al-based materials for a thin-film, the resistivity of the thin-film is limited at approximately 4 $\mu\Omega$·cm at most. In addition, when using the Al-based materials for the wiring lines on the organic EL display panel, it is a problem that the Al-based materials shows an electrochemical reaction with ITO generally used for the transparent electrode.

OBJECTS AND SUMMARY OF THE INVENTION

The present invention has been made in view of the problem mentioned above, and an object thereof is to provide wiring lines of a silver (Ag) or silver alloy wiring enabling to lower the electric resistance of the wiring on a substrate, and to improve the oxidation proof of the Ag-based wiring material. Another object of the present invention is to provide a display panel substrate with the wiring lines of silver or silver alloy bringing about a high display quality.

According to one aspect of the present invention, there is provided a layered wiring line of silver or silver alloy comprising: a silver or silver alloy conductor layer including silver or silver alloy; and a protective conductor layer layered on and covering the silver or silver alloy conductor layer.

In the layered wiring line of silver or silver alloy according to the present invention, a thickness of said protective conductor layer is set in such a manner that, in a case that said silver or silver alloy conductor layer and the protective conductor layer keep in contact with a liquid etchant, a ratio of (said protective conductor layer's thickness)/(said silver or silver alloy conductor layer's thickness) is less than that of (a solution velocity of said protective conductor layer in said liquid etchant)/(a solution velocity of said silver or silver alloy conductor layer in said liquid etchant).

According to another aspect of the present invention, there is provided a method for forming a layered wiring line of silver or silver alloy including a silver or silver alloy conductor layer including silver or silver alloy and a protective conductor layer layered on and covering the silver or silver alloy conductor layer, the method comprising the steps of:

layering the silver or silver alloy conductor layer and the protective conductor layer on a substrate in turn;

making said protective conductor layer in contact with a liquid etchant common to the silver or silver alloy conductor layer and the protective conductor layer by a predetermined pattern, wherein the protective conductor layer has a thickness satisfying a relationship in that a ratio of (said protective conductor layer's thickness)/(said silver or silver alloy conductor layer's thickness) is less than that of (a solution velocity of said protective conductor layer in said liquid etchant)/(a solution velocity of said silver or silver alloy conductor layer in said liquid etchant).

According to a further aspect of the present invention, there is provided a display panel substrate having a display array region comprising:

a substrate having a display array region including a plurality of display electrodes; and conductive connecting lines formed on the substrate and electrically connected to said display electrodes, wherein each of said connecting lines comprising: a silver or silver alloy conductor layer including silver or silver alloy; and a protective conductor layer layered on and covering said silver or silver alloy conductor layer.

The display panel substrate according to the present invention, further comprises organic electroluminescence devices each having organic functional layers and placed at the display electrodes.

BRIEF DESCRIPTION OF THE DRAWINGS

The aforementioned aspects and other features of the invention are explained in the following description, taken in connection with the accompanying drawing figures wherein.

DETAILED DESCRIPTION OF THE PREFERRED EMBODIMENTS

It has been conventionally difficult to realize the practical use of the Ag-based wiring with a low resistivity because of the low oxidation proof thereof. Inventors has studied a thin film and lines made of Ag-based materials and also made scientific experiments to adapt the Ag-based material such as Ag-Pd alloy or the like to the wiring material on the display panel substrate e.g., organic EL display panel. This is because Inventors anticipate that the Ag-based material hardly reacts electrochemically with ITO in comparison with Al-based materials and the resistivity of approximately 3 $\mu\Omega \cdot cm$ of the Ag-based material is lower than that of thin Al-based films.

Inventors has found that the Ag-based wiring lines formed on the organic EL display panel substrate are easily oxidized with a general substrate treatment and results in the marked rise of resistivity thereof. The general substrate treatment includes a UV/$O_3$ cleaning (Japanese patent Application Kokai No. 2001-311869) and an $O_2$ plasma treatment (C. C. Wu, C. I. Wu, J. C. Sturm, and A. Kahn, Appl. Phys. Lett. vol. 70 No. 11 1348 (1997)).

In the manufacture of the organic EL devices, the substrate is generally subjected to the UV/$O_3$ cleaning or $O_2$ plasma treatment, before the formation of the organic functional layers, to improve the luminescence efficiency of the device. The wiring is preformed using the Ag-based material in a single layer form for auxiliary electrodes to be connected to the transparent electrodes on the substrate. Then the UV/$O_3$ cleaning or $O_2$ plasma treatment is conducted on the substrate and the organic functional layers are formed on the electrodes. Since the auxiliary electrodes of Ag-based material are oxidized to increase the resistivity of the whole wiring lines, there is a difficult limit to the acquisition of a high performance organic EL display panel.

Inventors propose a multi layered wiring using Ag-based materials in the multi layer form instead of the single layer form i.e., which comprises: a silver or silver alloy conductor layer including silver or silver alloy; and a protective conductor layer layered on and covering said silver or silver alloy conductor layer. The protective conductor layer meets the following requirements (1)–(9) of characteristics and conditions:

(1) The oxidation proof of the protective conductor layer material is higher than that of the underlaid silver or silver alloy conductor layer. Even when being oxidized, the protective conductor layer material does not exhibit a marked rise of resistivity thereof.

(2) The protective conductor layer material has a comparatively high adherence to the underlaid silver or silver alloy conductor layer.

(3) The protective conductor layer material fails to react with the underlaid silver or silver alloy conductor layer by heating or the like.

(4) The protective conductor layer material has a stability and comparatively low conductivity so as to have a good contact resistance to another metal e.g., the cathode of the organic EL device in the thickness direction of junction to prevent the rise of resistance.

(5) The protective conductor layer has a necessary and sufficient condition of thickness for protecting the underlaid silver or silver alloy conductor layer.

(6) The protective conductor layer material withstands a patterning agent such as a developing solution, peeling solution or the like for the photoresist.

(7) The protective conductor layer material and the silver or silver alloy conductor layer material are dissolvable in a liquid etchant common to them.

(8) In the case of (7), the etching rates of the silver or silver alloy conductor layer material and the protective conductor layer material are not different very much from each other.

(9) In the case of (7), the protective conductor layer's thickness is set in such a manner that the ratio of (the protective conductor layer's thickness)/(the silver or silver alloy conductor layer's thickness) is less than that of (the protective conductor layer's etching rate)/(the silver or silver alloy conductor layer's etching rate).

Embodiments according to the present invention will be described in detail below with reference to the accompanying drawings.

Figure 1:
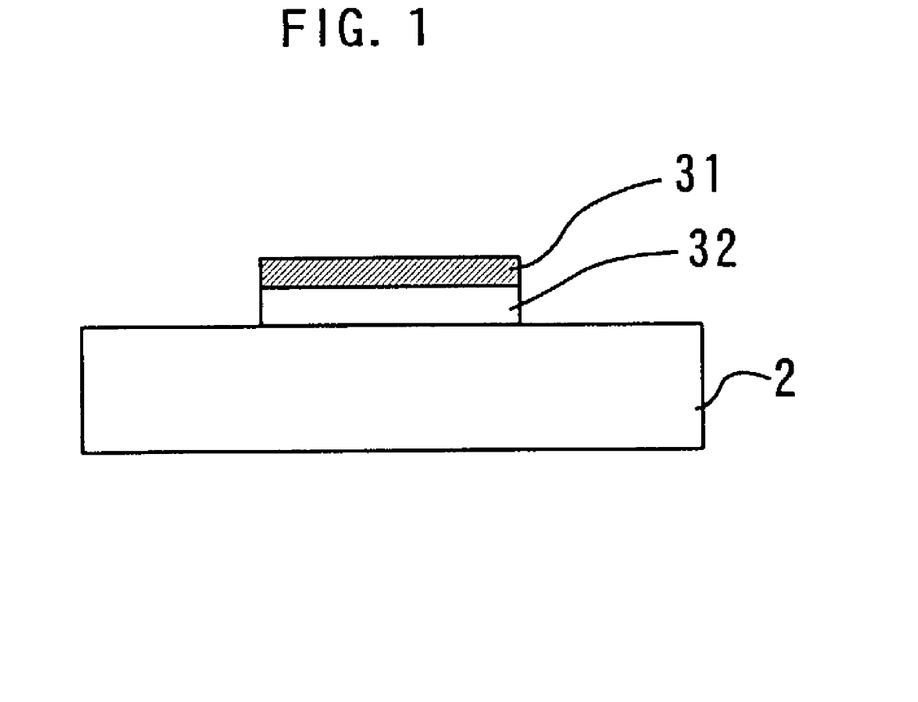
FIG. 1 is a schematic sectional view showing a layered wiring line of silver or silver alloy according to the present invention.

As shown in FIG. 1, a silver or silver alloy conductor layer 32 and a protective conductor layer 31 are layered in turn on a substrate 2 so as to be a multi layered wiring line. The protective conductor layer 31 covers and protects the underlaid silver or silver alloy conductor layer 32 to prevent oxidation of the conductor layer 32. As a result, even when the $UV/O_3$ cleaning or $O_2$ plasma treatment is conducted there is no increase of the resistance of the wiring line. The multi layered wiring line keeps its low resistance and increases the oxidation proof thereof so as to enhance the durability against the substrate treatment such as $UV/O_3$ cleaning and $O_2$ plasma treatment as well as the environmental resistance thereof.

The protective conductor layer 31 is formed by a material having an oxidation proof higher than that of the silver or silver alloy conductor layer 32 and alternatively by a material failing to exhibit a marked rise of resistivity thereof even when being oxidized. In addition, the protective conductor layer 31 have a durable thickness against the predetermined substrate treatment or having an environmental resistance within a thin thickness range as possible. Concretely it is preferable that the protective conductor layer 31 has a thickness of 50–1000 Å as dependent on the martial thereof. Of course a high adherence between both the layers is preferable.

Figure 2:
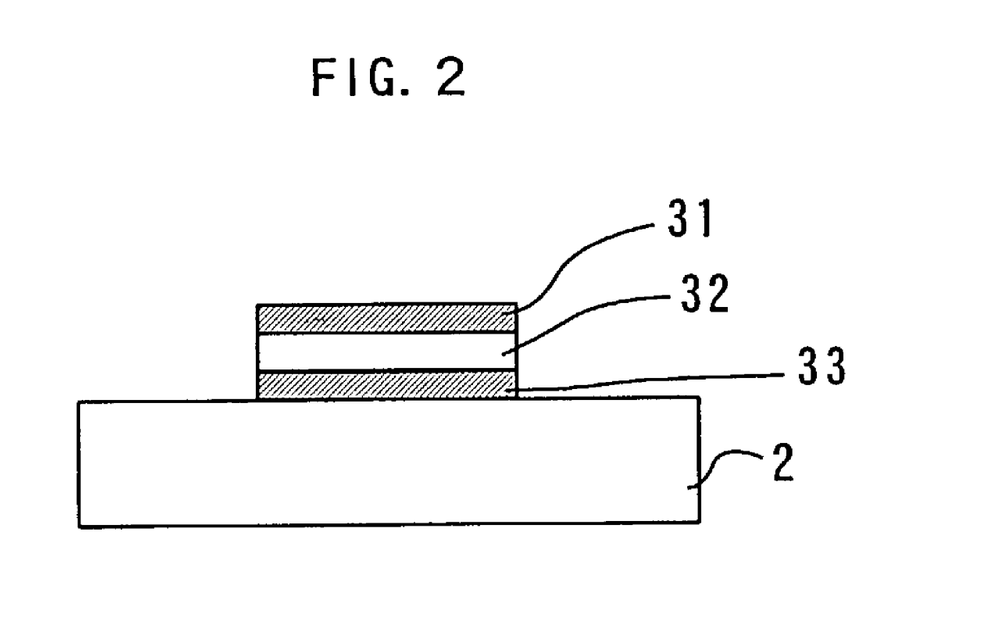
FIG. 2 is a schematic sectional view showing another embodiment of the layered wiring line of silver or silver alloy according to the present invention.

In addition, as shown in FIG. 2, a second protective conductor layer 33 may be provided between the underlaid silver or silver alloy conductor layer 32 and the substrate 2 to prevent an invasion of oxygen from the substrate 2 to the silver or silver alloy conductor layer 32.

The silver or silver alloy conductor layer 32 and the protective conductor layers 31 and 33 are formed by sputtering, evaporation, CVD (chemical vapor deposition) or the like.

The silver or silver alloy conductor layer 32 may be composed of Ag simplex or Ag alloy consisting of Ag and optional other substances. The Ag alloy may contain any substances of any kinds. The amount of the added substances other than Ag is less than 10 wt. % preferably, i.e., Ag amount is equal to or more than 90 wt. %, because the resistivity of the wiring is proportional to the amount of the substances other than Ag. For example, Table 1 shows electrical characteristics of various Ag alloy films.

TABLE 1

| Ag alloy film | Resistivity ($\mu\Omega \cdot cm$) |
| --- | --- |
| Ag-0.9Pd-1Cu | 3.1 |
| Ag-0.9Ru-1Cu | 8.9 |
| Ag-1Ru-1Au | 8.5 |
| Ag-2Mg | 5.6 |
| Ag-2Zn | 6.8 |
| Ag-2In | 6.8 |
| Ag-2SnO$_2$ | 5.1 |

(wherein numerals in Ag alloy films denote ratios wt. % of added inclusion)

The material of the protective conductor layer 31 is selected from materials each having oxidation proof higher than that of the underlaid silver or silver alloy conductor layer 32, or materials each failing to exhibit a marked rise of resistivity thereof when being oxidized. The high oxidation proof materials are preferably materials having high melt points such as Cr, Ta, W, Ti, Mo or the like or a simplex thereof or alloy including the same. There are also preferable materials having non-conductor layer at the surface to preventing oxidation from invading inside e.g., metal oxide such as Al simplex or Al alloy, ITO, indium zinc oxide (IZO), tin oxide, zinc oxide, indium oxide, magnesium oxide or the like, metal fluoride, metal nitride or the like. There are enumerated materials each failing to exhibit a marked rise of resistivity thereof when being oxidized such as Sn, Zn, In, Mg simplex or alloy of thereof or the like.

Figure 3:
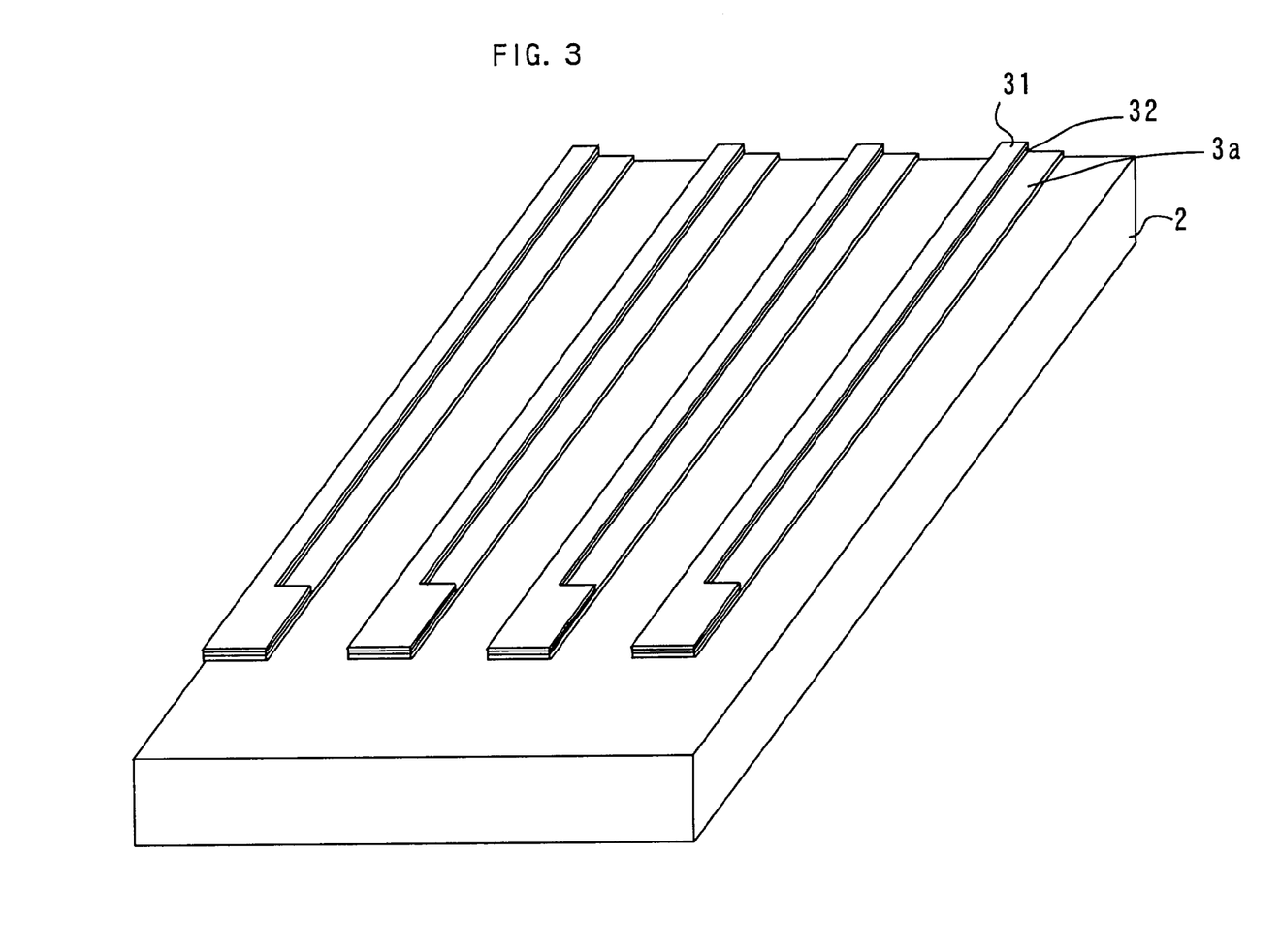
FIG. 3 is a schematic perspective views showing another embodiment of the layered wiring line of silver or silver alloy according to the present invention.

FIG. 3 shows a layered wiring line of silver or silver alloy on the organic EL display panel substrate according to another embodiment of the present invention. The layered wiring line of silver or silver alloy is used for an auxiliary electrode connected to a stripe transparent electrode 3a i.e., anode of ITO in the organic EL device. In this case, the underlaid silver or silver alloy conductor layer 32 is contact with the ITO anode previously formed on the substrate 2. When being contact with ITO, another metal used for an external electric terminal or the like, an organic material used for the cathode or the like of the organic EL device, the layered wiring line of silver or silver alloy should have both a high conductivity sufficient to prevent the rise of resistance in the thickness direction and a low contact resistance to metal or the like.

<First embodiments and comparative samples>

Ag-0.9Pd-1Cu alloy (hereinafter also referred to as "APC" wherein numerals denote ratios wt. % of added inclusion) is deposited by sputtering at a 2000 Å thickness on a glass substrate of 30 mm×30 mm as a silver or silver alloy conductor layer. A plurality of such substrates with the APC layer are prepared. In one group, Mo is deposited by sputtering on the APC layer as a protective conductor layer at a thickness of 100 Å as well as at 200 Å and at 300 Å for each substrate. In the other group, IZO is deposited by sputtering on the APC layer as the protective conductor layer at a thickness of 100 Å as well as at 200 Å and at 1000 Å for each substrate. These samples have been evaluated in the characteristics.

Besides comparative samples are manufactured in the same manner as the above embodiment samples except any protective conductor layer is not provided.

(1) Adherence (Check Pattern Test)

The latticework is formed on the lamination of the silver or silver alloy conductor layer and the protective conductor layer on each sample in such a manner that eleven deep cuts are made in rows and columns at a 1 mm interval respectively so as to arrange 100 pieces of squares as a check pattern. Then an adhesive tape is put on each sample having the check pattern. After that, the adhesive tape is peeled at a predetermined velocity from the check pattern to separate the squares of lamination from the substrate of each sample. By count of remaining squares on the substrate, the adherence of lamination is evaluated on each sample. Since it marks on a maximum scale of 100 points, 100/100 is the perfect score and 0/100 is the minimum score. Table 2 shows those results in the column of Adherence. There is no peeling between the silver or silver alloy conductor layer and the protective conductor layer every sample.

(2) Heat Characteristics

Each sample has been measured in the sheet resistance thereof before and after being heated by a hot plate at a temperature of 300° C. for 10 minutes. Table 2 shows those results in the column of Heating test. Notwithstanding the protective conductor layer, the kinds thereof and the thickness thereof, the sheet resistance of the samples after heated increases approximately 1.2 times as before. The heat characteristic of each sample is not influenced by the lamination of the protective conductor layer, (3) Oxidation Proof (Durability to UV/O$_3$ Cleaning)

Each sample has been measured in the sheet resistance thereof before and after being cleaned with a UV/O$_3$ cleaning device made by Takizawa sangyo Co. Ltd. for 10 minutes. Table 2 shows those results in the column of Oxidation proof test. The cleaned samples without protective conductor layer have increases of sheet resistance and changes of dark color in comparison with before ones. However the cleaned samples with protective conductor layer fail to exhibit any increase of sheet resistance and any change of color in comparison with before ones. It is found that the protective conductor layer improves the oxidation proof and that the protective conductor layer having even approximately 100 Å can exhibit the similar advantageous effect to the above samples.

TABLE 2

| Protective conductor layer | | | Heating test Sheet resistance($\Omega$/□) | | Oxidation proof test Sheet resistance($\Omega$/□) | |
| --- | --- | --- | --- | --- | --- | --- |
| Material | Tickness (Å) | Adherence | Before | After | Before | After |
| Absent | — | 100/100 | 0.183 | 0.220 | 0.181 | 0.317 |
| Mo | 100 | 100/100 | 0.160 | 0.190 | 0.162 | 0.162 |
| Mo | 200 | 100/100 | 0.160 | 0.188 | 0.157 | 0.155 |
| Mo | 300 | 100/100 | 0.155 | 0.178 | 0.157 | 0.157 |
| IZO | 100 | 100/100 | 0.181 | 0.215 | 0.181 | 0.181 |
| IZO | 200 | 100/100 | 0.179 | 0.223 | 0.178 | 0.179 |
| IZO | 1000 | 100/100 | 0.178 | 0.221 | 0.181 | 0.182 |

The low resistivity wiring material is processed to a minute pattern. The minute patterning utilizes generally the photolithography. In the above case, the photolithography patterning of the wiring material requires two etching steps both for the protective conductor layer and the silver or silver alloy conductor layer and thus the manufacture of device may involve many more steps than that of a single layer of the silver or silver alloy conductor layer. To suppress the increase of steps according to the present invention, the protective conductor layer material is selected from a group substances capable of being etched by the same conditions as the silver or silver alloy conductor layer in order to use a liquid etchant in common to the silver or silver alloy conductor layer and the protective conductor layer by a predetermined pattern. Of cause, the protective conductor layer material should have a sufficient durability against the treatment liquid used in the photolithography step such as a developing solution for the photoresist, a peeling solution or the like.

The silver or silver alloy conductor layer generally has a large etching rate, particularly a fast progress of side-etching in the wet etching. Therefore, in the wet etching, the concurrent etching process is preformed as shown in FIGS. 4–6.

Figure 4:
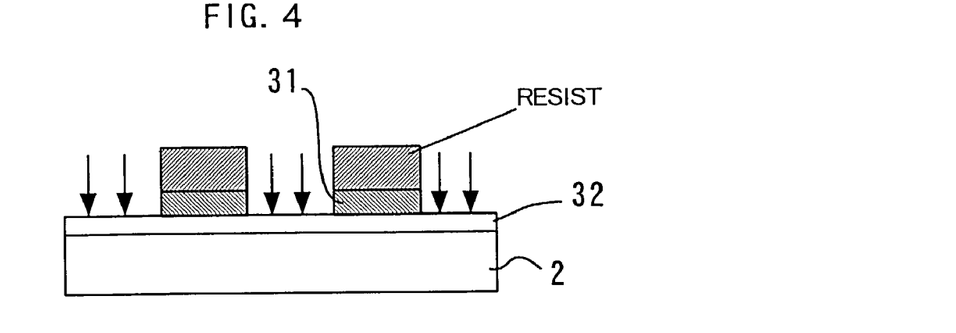
FIGS. 4, 5, 6, 7, 8 and 9 are schematic sectional views each showing an etching progress for layering a silver or silver alloy conductor layer and a protective conductor layer in a method for forming a layered wiring line of silver or silver alloy on a substrate according to the present invention.

FIG. 4 shows the end of etching a thick protective conductor layer 31 which is layered on the silver or silver alloy conductor layer 32. From the top of FIG. 4, the etching proceeds downward in the arrow direction to the bottom of the protective conductor layer and then the underlaid silver or silver alloy conductor layer 32 is exposed.

Figure 5:
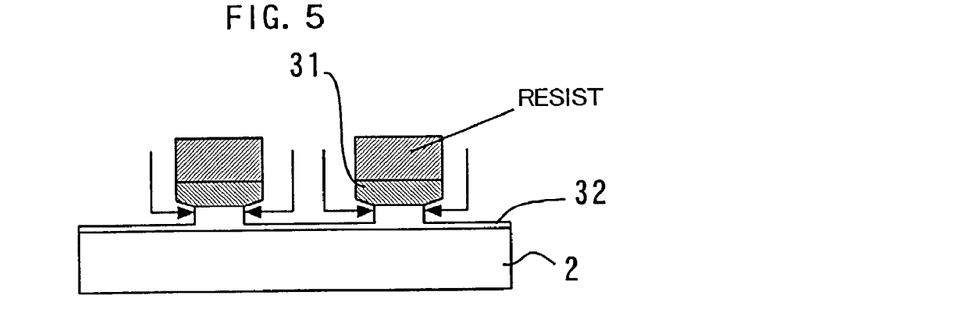

FIG. 5 shows the state of the etching at the middle of the silver or silver alloy conductor layer 32. Since the silver or silver alloy conductor layer 32 has the fast side-etching progress, it is side-etched faster than the thick protective conductor layer 31. The bottom edge of the thick protective conductor layer 31 is dissolved from the bottom by the etchant entering the side-etched portion of the underlaid silver or silver alloy conductor layer 32 as shown in the right angled arrow direction of FIG. 5.

Figure 6:
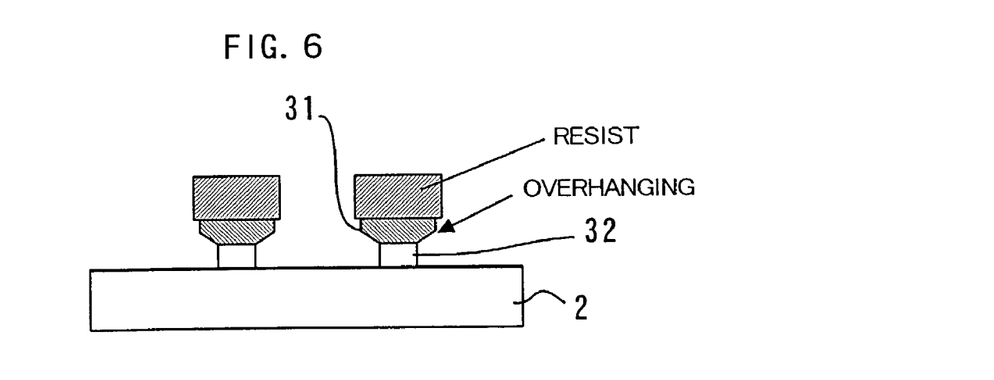

FIG. 6 shows the completion of the concurrent etching. Since the side-etched amount of the thick protective conductor layer 31 is small in comparison with that of the silver or silver alloy conductor layer 32, the multi layered wiring line has a section profile formed in an overhanging "T-shape".

In the wiring pattern having the T-shaped sectional form as shown in FIG. 6, the overlaid protective conductor layer is easily peeled from the underlaid silver or silver alloy conductor layer. As a result, such peeling causes defective products. To avoid such a problem, the protective conductor layer material having a side-etched property more than that of the underlaid silver or silver alloy conductor layer. However, Ag-based layer generally has a very high side-etched property. There is few materials having a side-etched property larger than that of Ag-based layer. Thus Inventors proposes that the thickness of the protective conductor layer material should be set in such a manner that a ratio of (the protective conductor layer's thickness)/(the silver or silver alloy conductor layer's thickness) is less than that of (the protective conductor layer's etching rate)/(the silver or silver alloy conductor layer's etching rate). By that setting, the concurrent etching process proceeds as shown in FIGS. 7–9 to obtain a good sectional form of wiring pattern, even if a material for the protective conductor layer has a low side-etched property.

Figure 7:
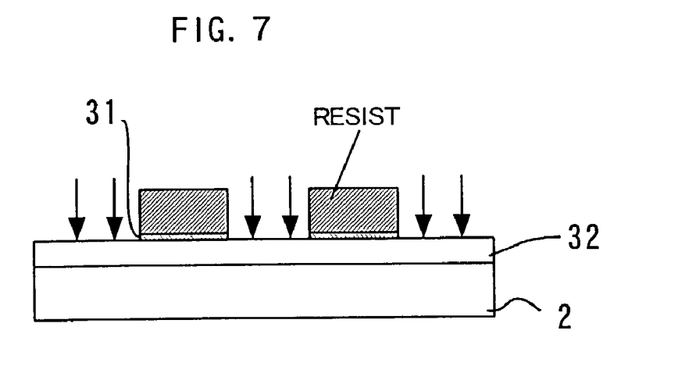

FIG. 7 shows the end of etching a thin protective conductor layer 31 which is layered on the silver or silver alloy conductor layer 32. From the top of FIG. 7, the etching proceeds downward in the arrow direction to the bottom of the protective conductor layer and then the underlaid silver or silver alloy conductor layer 32 is exposed.

Figure 8:
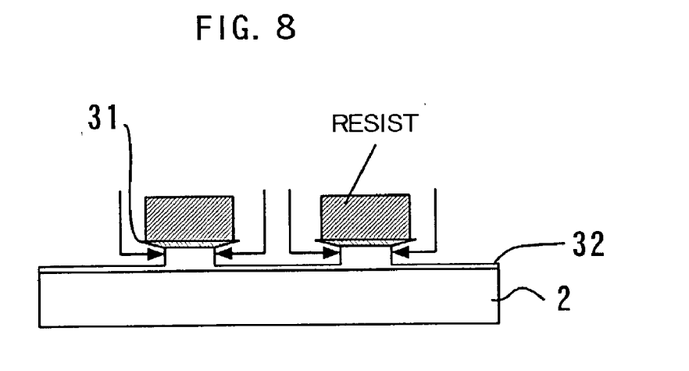

FIG. 8 shows the state of the etching at the middle of the silver or silver alloy conductor layer 32. The silver or silver alloy conductor layer 32 is side-etched faster than the thin protective conductor layer 31 since it has the fast side-etching progress. As shown in the right angled arrow direction of FIG. 8, the thin protective conductor layer 31 is rapidly dissolved from the bottom thereof by the etchant entering the side-etched portion of the silver or silver alloy conductor layer 32 because the protective conductor layer 3 has a specific thickness provided above.

Figure 9:
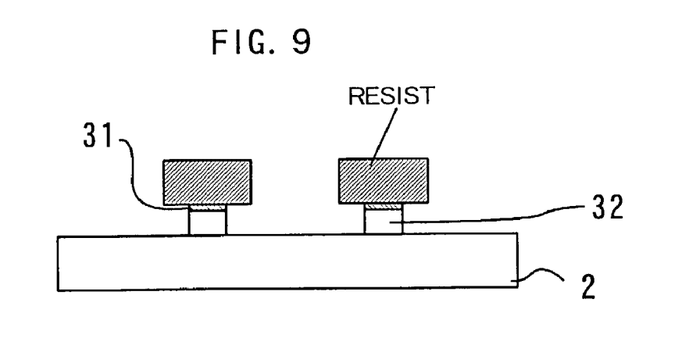

FIG. 9 shows the completion of the concurrent etching. Since the protective conductor layer 31 is thin, it is dissolved at the substantially same level of the silver or silver alloy conductor layer 32 by the etchant entering the side-etched portion thereof. As a result, no portion thought to be overhung like FIG. 6 is perfectly dissolved, so that the resultant multi layered wiring line has a good section profile such as a rectangle form as shown in FIG. 1.

For example, in the case that the protective conductor layer has an etching rate of 5 Å/sec. and the silver or silver alloy conductor layer has an etching rate of 50 Å/sec. With respect to a common etchant, the ratio of (the protective conductor layer's etching rate)/(the silver or silver alloy conductor layer's etching rate) is 1/10. When the silver or silver alloy conductor layer is set to have a thickness of 2000 Å, the thickness of the protective conductor layer is set to be less than 2000 Å×1/10=200 Å to obtain a good sectional form of the multi layered wiring line. The protective conductor layer should have the minimum thickness sufficient for durability against the predetermined substrate treatment.

<Second Embodiments and Comparative Samples>

Ag-0.9Pd-1Cu alloy is used for the silver or silver alloy conductor layer and IZO is used for the protective conductor layer. Both the layers are etched by the liquid etchant of aqueous mixture consisting of phosphoric acid, nitric acid and acetic acid respectively, and then the etching rates thereof are measured. As a result, APC has approximately 32 Å/sec. and IZO has approximately 4 Å/sec. in the stable dissolution state at a ratio 1/8 of the etching rates IZO/APC.

APC is deposited by sputtering at a 2000 Å thickness on a glass substrate of 30 mm×30 mm as the silver or silver alloy conductor layer. A plurality of such substrates with APC layer are prepared. IZO is deposited by sputtering on the APC layer as the protective conductor layer at a thickness of 100 Å as well as at 200 Å, at 300 Å and at 500 Å for each substrate. The samples of the protective conductor layer having a thickness less than 2000 Å×1/8=250 Å belong to the embodiment, the others are comparative samples.

The stripe pattern mask of Line (μm)/Space (μm)=10/100 is formed on the lamination of the silver or silver alloy conductor layer and the protective conductor layer on each sample by using the photoresist OFPR-800 made by Tokyo ohka kogyo Co. Ltd. through a predetermined steps. Each sample is etched by the liquid etchant of aqueous mixture consisting of phosphoric acid, nitric acid and acetic acid. After that, the remaining resist is peeled and then the resultant pattern is observed. Table 3 shows those results. The samples satisfying the conditions that a ratio of (the protective conductor layer's thickness)/(the silver or silver alloy conductor layer's thickness) is less than that of (the protective conductor layer's etching rate)/(the silver or silver alloy conductor layer's etching rate), obtain a good rectangle sectional form of wiring line without any overhanging portion.

TABLE 3

| IZO thickness (Å) | Overhanging portion |
|---|---|
| 100 | Absence |
| 200 | Absence |
| 300 | Presence |
| 500 | Presence |

According to the present invention, the protective conductor layer is layered on the Ag-based material layer under a necessary and sufficient condition for the thickness thereof. Therefore it is possible to use the Ag-based material on the printed circuit substrate while retaining its low resistivity in the high oxidation proof and high environmental resistance, although such a retainment is difficult conventionally.

Particularly the multi layered wiring line according to the present invention is pertinent to the organic EL device application, because UV/$O_3$ cleaning or $O_2$ plasma treatment can be preformed before the formation of the organic functional layers to obtain an organic EL device having a high luminescence efficiency, although such treatments are conventionally difficult before the formation of the organic functional layers.

Besides, according to the present invention, the protective conductor layer and the underlaid silver or silver alloy conductor layer can be dissolved and removed under the same etching conditions, so that the multi layered wiring line can be patterned similarly to the single layer made of the Ag-based material.

Further, according to the present invention, the thickness of the protective conductor layer material is set in such a manner that a ratio of (the protective conductor layer's thickness)/(the silver or silver alloy conductor layer's thickness) is less than that of (the protective conductor layer's etching rate)/(the silver or silver alloy conductor layer's etching rate), so that the multi layered wiring line can obtain a good wiring pattern having a pertinent sectional form.

Figure 10:
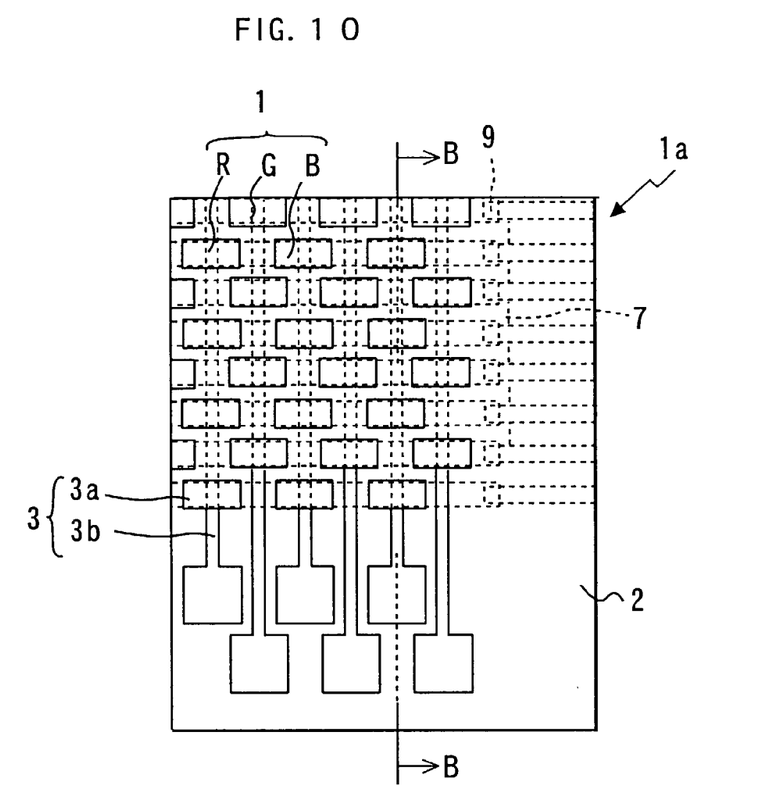
FIG. 10 is a schematically partly enlarged plan view of a display panel substrate showing another embodiment of the layered wiring line of silver or silver alloy according to the present invention.

FIG. 10 is a partially enlarged front view of an organic EL display panel according to another embodiment, viewed through the panel from the front. As illustrated in FIG. 10, the organic EL display panel has an image display array region 1a comprised of a plurality of light emitting pixels 1 which are arranged in matrix on a transparent substrate 2 made of glass or the like. Each of light emitting pixels consists of light emitting portions for red R, green G and blue B emissions. A light emitting portion, i.e., organic EL device is formed at the position of an insular transparent electrode 3a at an intersection of a first display electrode line 3 in the horizontal direction, i.e., an anode, and a second display electrode line 9 in the vertical direction, i.e., a cathode. The first display electrode 3, i.e., the anode comprises an auxiliary electrode 3b which electrically connects the insular transparent electrodes 3a in the horizontal direction. The organic EL display panel comprises a plurality of ramparts 7 disposed between the organic EL devices on the substrate 2.

The layered wiring line of silver or silver alloy according to the present invention is adapted to the auxiliary electrode 3b connected to the anode of the first display electrode 3 as well as the cathode of the second display electrode line 9.

Figure 11:
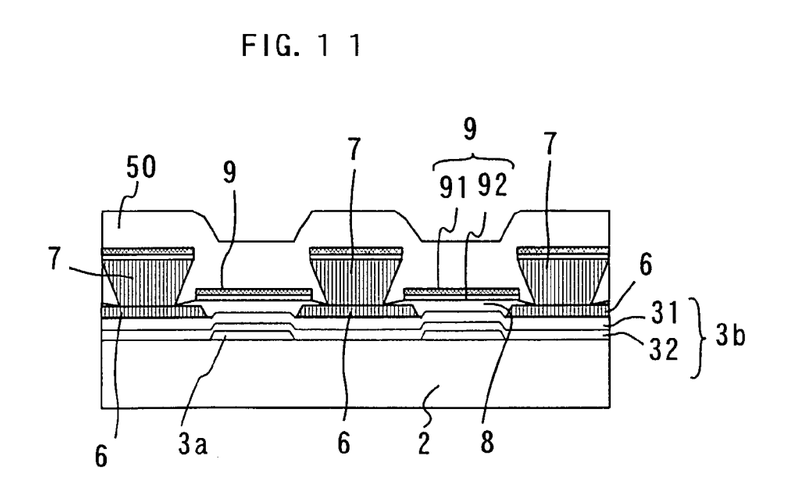
FIG. 11 is a partly enlarged sectional view taken along the line B—B of FIG. 10.

As shown in FIG. 11, the auxiliary electrode 3b consists of the silver or silver alloy conductor layer 32 and the protective conductor layer 31 which are layered in turn on the substrate 2. The cathode of the second display electrode line 9 consists of the silver or silver alloy conductor layer 92 and the protective conductor layer 91 which are layered in turn on the organic functional layers 8 after the formation of the rampart 7. The ramparts 7 and the organic EL devices are covered with protective coatings 50.

Each of the organic EL devices is comprised of a first display electrode line 3, one or more organic functional layers 8 including a light emitting layer made of an organic compound, and a second display electrode 9, laminated in order on a substrate 2. The ramparts 7 are disposed between the organic EL devices such that they protrude from the substrate. For example, each of the organic EL devices is fabricated by vapor depositing or sputtering an anode 3 as an optically transparent first display electrode made of ITO on the transparent glass substrate 2. On the anode 3, a hole injection layer made of copper phtahlocyanine; a hole transport layer made of TPD (triphenylamine derivative); a light emitting layer made of Alq3 (aluminum chelate complex); and an electron injection layer made of Li2O (lithium oxide) are sequentially vapor deposited to form the organic functional layer 8. Further, on the organic functional layer 8, a cathode 9 made of aluminum (Al) is deposited by vapor deposition to oppose the electrode pattern of the anode 3 as a second display electrode. Optionally, the first display electrode line 3 may be covered with an insulating film 6 except for a pixel portion of the insular transparent electrode 3a.

The protective coatings 50 comprises an internal inorganic passivation film which covers organic EL devices and the ramparts 7; a sealing film made of a resin for covering the internal inorganic passivation film; and an inorganic passivation film made of an inorganic material for covering the sealing film. The internal inorganic passivation film is made of a nitride such as silicon nitride, an oxide, or an inorganic material such as carbon. As a resin comprising the sealing film, a fluorine-based or silicon-based resin, or a synthetic resin such as a photo resist, polyimide and so on may be used.

According to the present invention, the multi layered wiring enables to lower the resistance of wiring or connecting lines of the printed circuit. Besides, the display panel substrate of the present invention can realize a high quality display panel without luminance in homogeneousness.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on a Japanese Patent Application No. 2001-222024 which is hereby incorporated by reference.

What is claimed is:

1. A layered wiring line of silver or silver alloy comprising:
    a silver or silver alloy conductor layer including silver or silver alloy; and
    a protective conductor layer layered on and covering said silver or silver alloy conductor layer,
    wherein a thickness of said protective conductor layer is set in such a manner that, in a case that said silver or silver alloy conductor layer and the protective conductor layer keep in contact with a liquid etchant, a ratio of Tp/Ts is less than that of Vp/Vs, wherein Tp denotes said protective conductor layer's thickness, Ts denotes said silver or silver alloy conductor layer's thickness, Vp denotes a solution velocity of said protective conductor layer in said liquid etchant, and Vs denotes a solution velocity of said silver or silver alloy conductor layer in said liquid etchant.

2. A method for forming a layered wiring line of silver or silver alloy including a silver or silver alloy conductor layer including silver or silver alloy and a protective conductor layer layered on and covering the silver or silver alloy conductor layer, the method comprising the steps of:
    layering the silver or silver alloy conductor layer and the protective conductor layer on a substrate in turn;
    making said protective conductor layer in contact with a liquid etchant common to the silver or silver alloy conductor layer and the protective conductor layer by a predetermined pattern,
    wherein the protective conductor layer has a thickness satisfying a relationship in that a ratio of Tp/Ts is less than that of Vp/Vs, wherein Tp denotes said protective conductor layer's thickness, Ts denotes said silver or silver alloy conductor layer's thickness, Vp denotes a solution velocity of said protective conductor layer in said liquid etchant, and Vs denotes a solution velocity of said silver or silver alloy conductor layer in said liquid etchant.

3. A display panel substrate having a display array region comprising:
    a substrate having a display array region including a plurality of display electrodes; and
    conductive connecting lines formed on the substrate and electrically connected to said display electrodes, wherein each of said connecting lines comprises:
    a silver or silver alloy conductor layer including silver or silver alloy; and
    a protective conductor layer layered on and covering said silver or silver alloy conductor layer,
    wherein a thickness of said protective conductor layer is set in such a manner that, in a case that said silver or silver alloy conductor layer and the protective conductor layer keep in contact with a liquid etchant, a ratio of Tp/Ts is less than that of Vp/Vs, wherein Tp denotes said protective conductor layer's thickness, Ts denotes said silver or silver alloy conductor layer's thickness, Vp denotes a solution velocity of said protective conductor layer in said liquid etchant, and Vs denotes a solution velocity of said silver or silver alloy conductor layer in said liquid etchant.

4. The display panel substrate of claim 3, further comprising organic electroluminescence devices each being placed at the display electrodes and having organic functional layers.

* * * * *